(12) United States Patent
Wu et al.

(10) Patent No.: US 9,929,268 B2
(45) Date of Patent: Mar. 27, 2018

(54) FIN FIELD EFFECT TRANSISTOR AND METHOD FOR FABRICATING THE SAME

(71) Applicant: Taiwan Semiconductor Manufacturing Co., Ltd., Hsinchu (TW)

(72) Inventors: Chii-Ming Wu, Taipei (TW); Ru-Shang Hsiao, Hsinchu County (TW); Hung Pin Chen, Kaohsiung (TW); Sen-Hong Syue, Hsinchu County (TW); Chi-Cherng Jeng, Tainan (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 40 days.

(21) Appl. No.: 15/099,607

(22) Filed: Apr. 15, 2016

(65) Prior Publication Data

US 2017/0301793 A1    Oct. 19, 2017

(51) Int. Cl.
*H01L 29/78* (2006.01)
*H01L 29/04* (2006.01)
*H01L 29/66* (2006.01)

(52) U.S. Cl.
CPC ........ *H01L 29/7848* (2013.01); *H01L 29/045* (2013.01); *H01L 29/66803* (2013.01); *H01L 29/7851* (2013.01)

(58) Field of Classification Search
None
See application file for complete search history.

(56) References Cited

U.S. PATENT DOCUMENTS

2014/0299923 A1* 10/2014 Chang ............... H01L 21/26533
                                                              257/288
2015/0228794 A1    8/2015 Hsiao et al.

OTHER PUBLICATIONS

Ohmi et al., "Science-based New Silicon Technologies Exhibiting Super High Performance due to Radical-reaction-based Semiconductor Manufacturing", Journal of the Korean Physical Society, Aug. 2011, pp. 391-401.
Cheng et al., "Very High Performance CMOS on Si(551) Surface using Radical Oxidation Silicon Flattening Technology and Accumulation-mode SOI Device Structure", 216th ECS Meeting, Abstract #2355, The Electrochemical Society, Oct. 4-9, 2009, pp. 1.

* cited by examiner

*Primary Examiner* — Steven Loke
*Assistant Examiner* — Juanita Rhodes
(74) *Attorney, Agent, or Firm* — JCIPRNET

(57) ABSTRACT

A method of fabricating a FinFET includes at last the following steps. A <551> direction is determined by tilting 8.05±2 degrees from a normal vector of a (110) lattice plane of a semiconductor substrate. The semiconductor substrate is patterned along a lattice plane perpendicular to the <551> direction, so as to form a plurality of trenches in the semiconductor substrate and at least one semiconductor fin having sidewalls disposed on a (551) lattice plane. Insulators are in the trenches. A gate stack is formed over portions of the semiconductor fin and over portions of the insulators. Strained material portions are formed over the semiconductor fins revealed by the gate stack.

20 Claims, 11 Drawing Sheets

FIN FIELD EFFECT TRANSISTOR AND METHOD FOR FABRICATING THE SAME

BACKGROUND

As the semiconductor devices keeps scaling down in size, three-dimensional multi-gate structures, such as the fin-type field effect transistor (FinFET), have been developed to replace planar Complementary Metal Oxide Semiconductor (CMOS) devices. A structural feature of the FinFET is the silicon-based fin that extends upright from the surface of the semiconductor substrate, and the gate wrapping around the conducting channel that is formed by the fin further provides a better electrical control over the channel.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
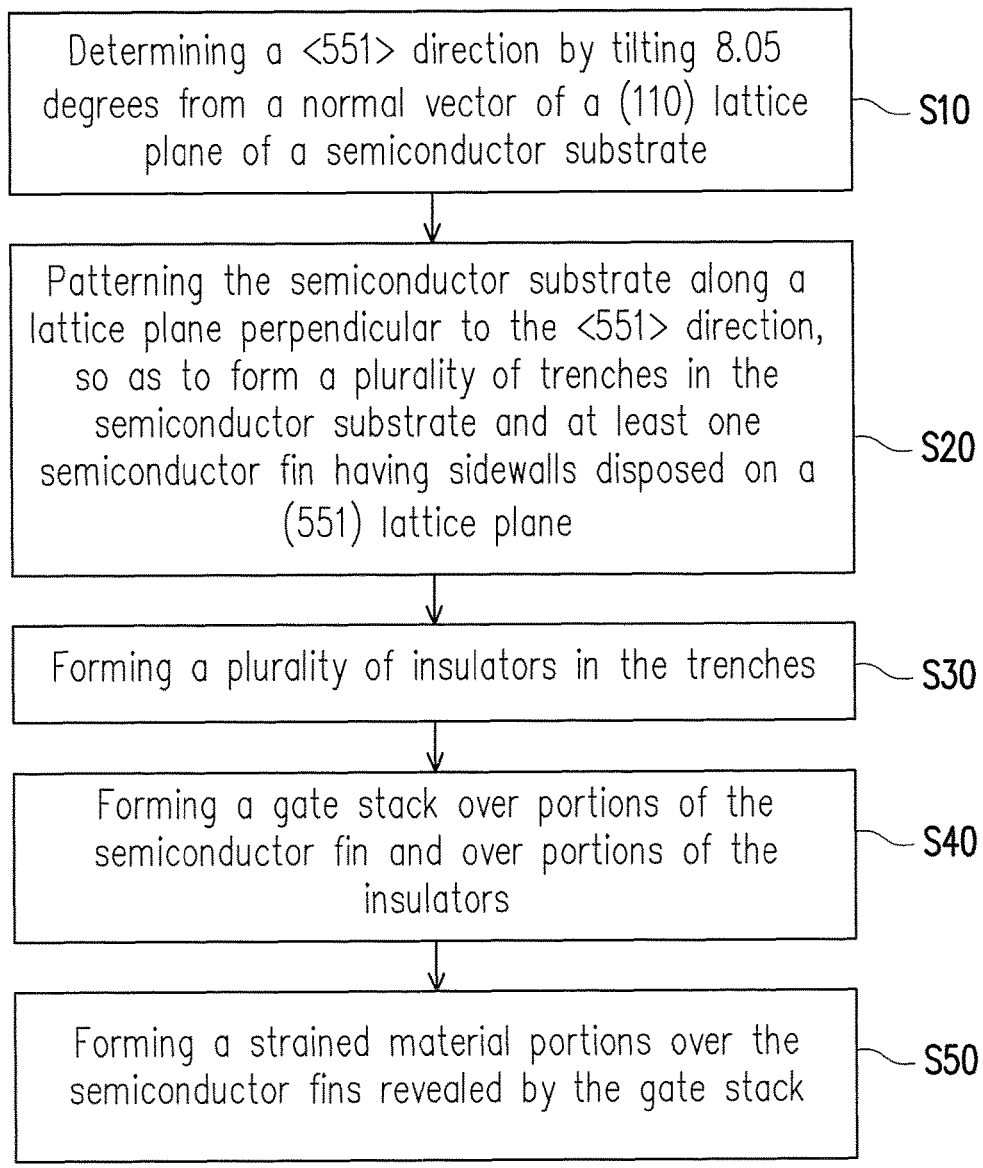
FIG. 1 is a flow chart illustrating a method for fabricating a FinFET in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The embodiments of the present disclosure describe the exemplary manufacturing process of FinFETs and the FinFETs fabricated there-from. The FinFET may be formed on bulk silicon substrates in certain embodiments of the present disclosure. Still, the FinFET may be formed on a silicon-on-insulator (SOI) substrate as alternatives. Also, in accordance with the embodiments, the silicon substrate may include other conductive layers or other semiconductor elements, such as transistors, diodes or the like. The embodiments are not limited in this context.

Referring to FIG. 1, illustrated is a flow chart illustrating a method for fabricating a FinFET in accordance with some embodiments of the present disclosure. The method at least includes steps S10, step S20, step S30, step S40 and step S50. First, in step S10, a <551> direction is determined by tilting 8.05 degrees from a normal vector of a (110) lattice plane of a semiconductor substrate, which the (110) lattice plane of the semiconductor substrate refers to a silicon (110) lattice plane of the semiconductor substrate. Then, in step S20, the semiconductor substrate is patterned along a lattice plane perpendicular to the <551> direction, so as to form a plurality of trenches in the semiconductor substrate and at least one semiconductor fin having sidewalls disposed on a (551) lattice plane. Then, in step S30, insulators are formed on the semiconductor substrate and located in the trenches. The insulators are shallow trench isolation (STI) structures for insulating or isolating the semiconductor fins, for example. Thereafter, in step S40, a gate stack is formed over portions of the semiconductor fin and over the insulators; in step S50, strained material portions are formed to cover the semiconductor fin revealed by the gate stack. As illustrated in FIG. 1, the strained material portions are formed after formation of the gate stack. However, formation sequence of the gate stack (step S40) and the strained material portions (step S50) is not limited in the present disclosure. In one embodiment, the <551> direction may be determined by tilting 8.05±2 degrees from the normal vector of the (110) lattice plane of a semiconductor substrate.

Figure 2A:
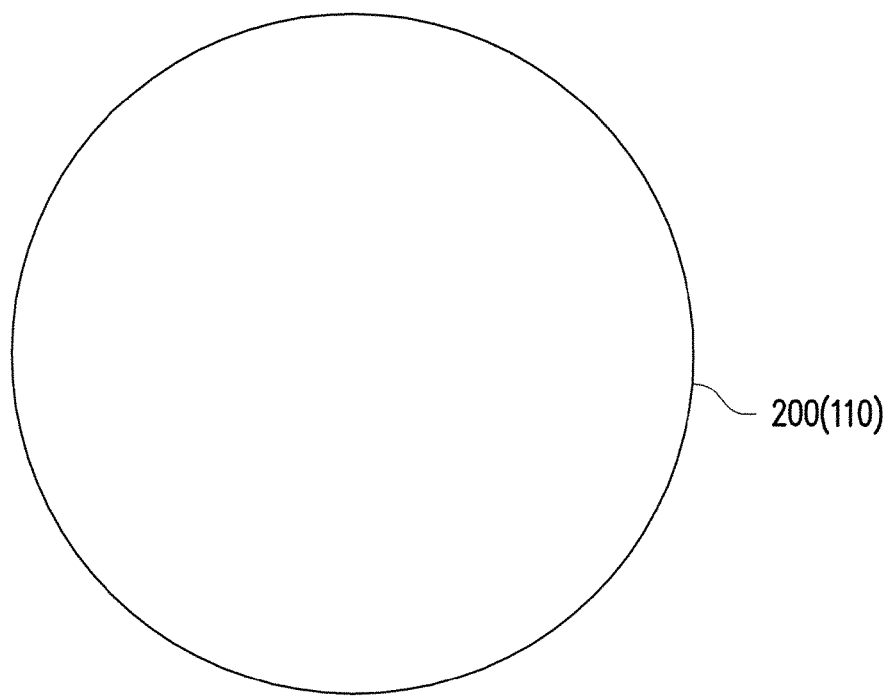
FIG. 2A is a top view of a semiconductor substrate.
Figure 2B:
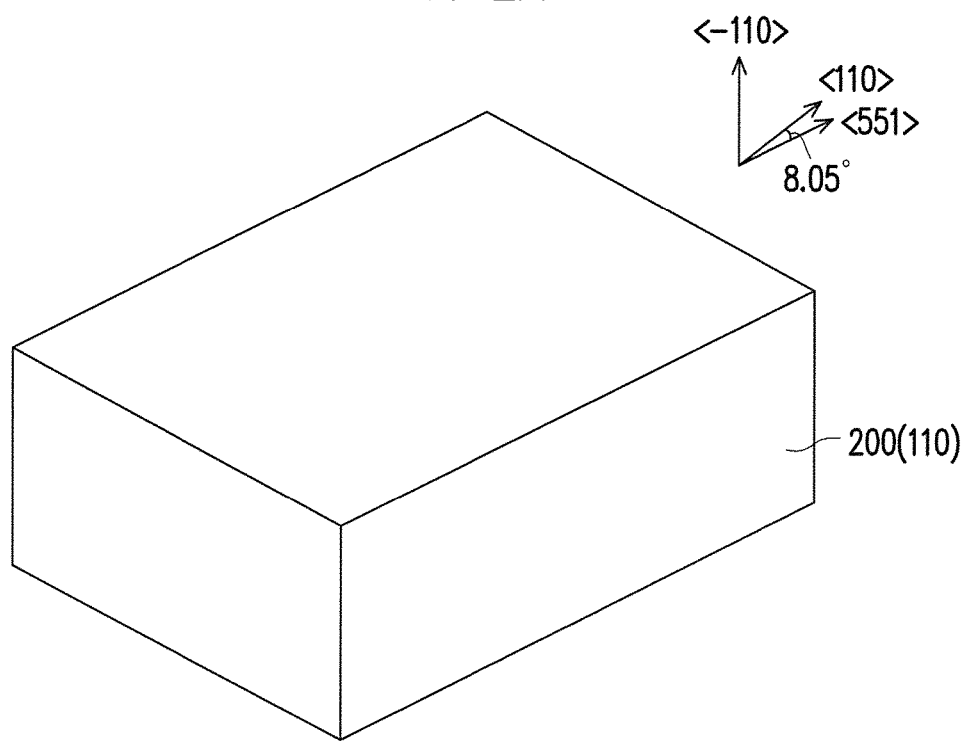
FIG. 2B is a perspective view of an enlarged region of the semiconductor substrate depicted in FIG. 2A.

FIG. 2A is a top view of a semiconductor substrate, and FIG. 2B is a perspective view of the semiconductor substrate, where FIG. 2B is an enlarged view of a portion of the semiconductor substrate depicted in FIG. 2A. As shown in FIG. 2A and FIG. 2B, a semiconductor substrate 200 is provided. In one embodiment, the semiconductor substrate 200 comprises a crystalline silicon substrate, for example, a silicon (110) wafer. Then, as viewed in a three-dimensional space (e.g., a three-dimensional (3D) Cartesian coordinate system), a silicon (110) lattice plane of the semiconductor substrate 200 and a normal vector of the silicon (110) lattice plane are sequentially determined. The normal vector of the silicon (110) lattice plane is in a <110> direction; and in such case, a <−110> direction is perpendicular to the <110> direction. In one embodiment, the silicon (110) lattice plane is pre-selected in order to determine the <110> direction. Then, a <551> direction is determined by tilting an angle of 8.05 degrees from the <110> direction (e.g., the normal vector of the silicon (110) lattice plane), along any direction in the three-dimensional space. According to some embodiments, the semiconductor substrate 200 may further comprise various doped regions depending on design requirements (e.g., p-type semiconductor substrate or n-type semiconductor substrate). In some embodiments, the doped regions may be doped with p-type dopants or n-type dopants. For example, the doped regions may be doped with p-type dopants, such as boron or $BF_2$; n-type dopants, such as phosphorus or arsenic; and/or combinations thereof. The doped regions may be configured for an n-type FinFET, or alternatively configured for a p-type FinFET. In some embodiments, the <551> direction may be determined by tilting 8.05±2 degrees from the normal vector of the (110) lattice plane of a semiconductor substrate.

Figure 3A:
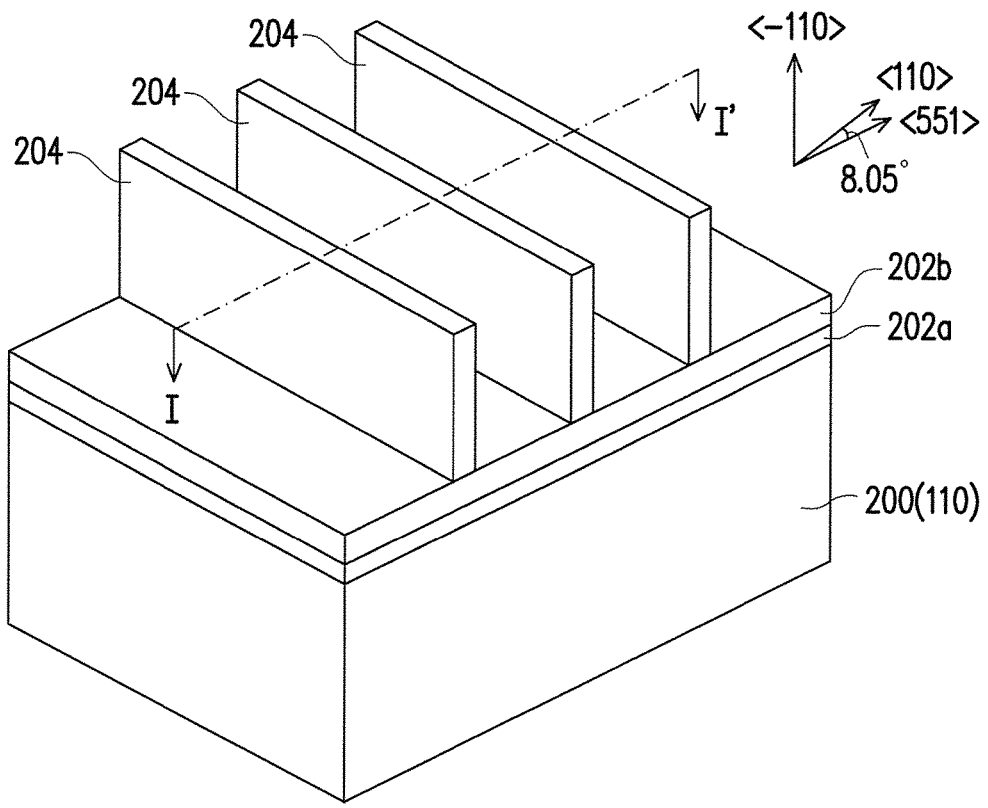
FIGS. 3A-3G are perspective views of a method for fabricating a FinFET in accordance with some embodiments.
Figure 4A:
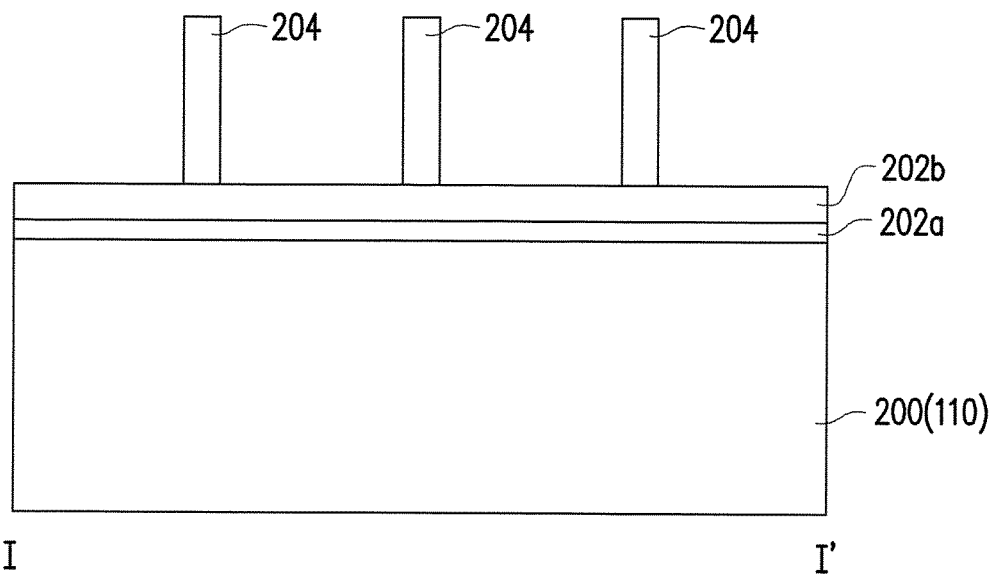
FIGS. 4A-4G are cross-sectional views of a method for fabricating a FinFET in accordance with some embodiments.

FIG. 3A is a perspective view of the FinFET at one of various stages of the manufacturing method, and FIG. 4A is a cross-sectional view of the FinFET taken along the line I-I' of FIG. 3A, where the line I-I' extends in the <551> direction. In Step 10 in FIG. 1 and as shown in FIG. 3A and FIG. 4A, a patterned photoresist layer 204 is formed over the semiconductor substrate 200. In one embodiment, a photoresist layer (not shown) is first formed and then patterned perpendicular to the <551> direction. Then, the patterned photoresist layer 204 having an extending direction perpendicular to the <551> direction is formed. In one embodiment, the photoresist layer may be formed, for example, by a spin coat method, a dip coat method or a suitable coating method; and the photoresist layer may be patterned, for example, by photolithographic process. In one embodiment, before the patterned photoresist layer 204 being formed, a pad layer 202a and a mask layer 202b are sequentially formed on the semiconductor substrate 200. The pad layer 202a may be a silicon oxide thin film formed, for example, by thermal oxidation process. The pad layer 202a may act as an adhesion layer between the semiconductor substrate 200 and mask layer 202b. The pad layer 202a may also act as an etch stop layer for etching the mask layer 202b. In at least one embodiment, the mask layer 202b is a silicon nitride layer formed, for example, by low-pressure chemical vapor deposition (LPCVD) or plasma enhanced chemical vapor deposition (PECVD). The mask layer 202b is used as a hard mask during subsequent photolithography processes.

Figure 3B:
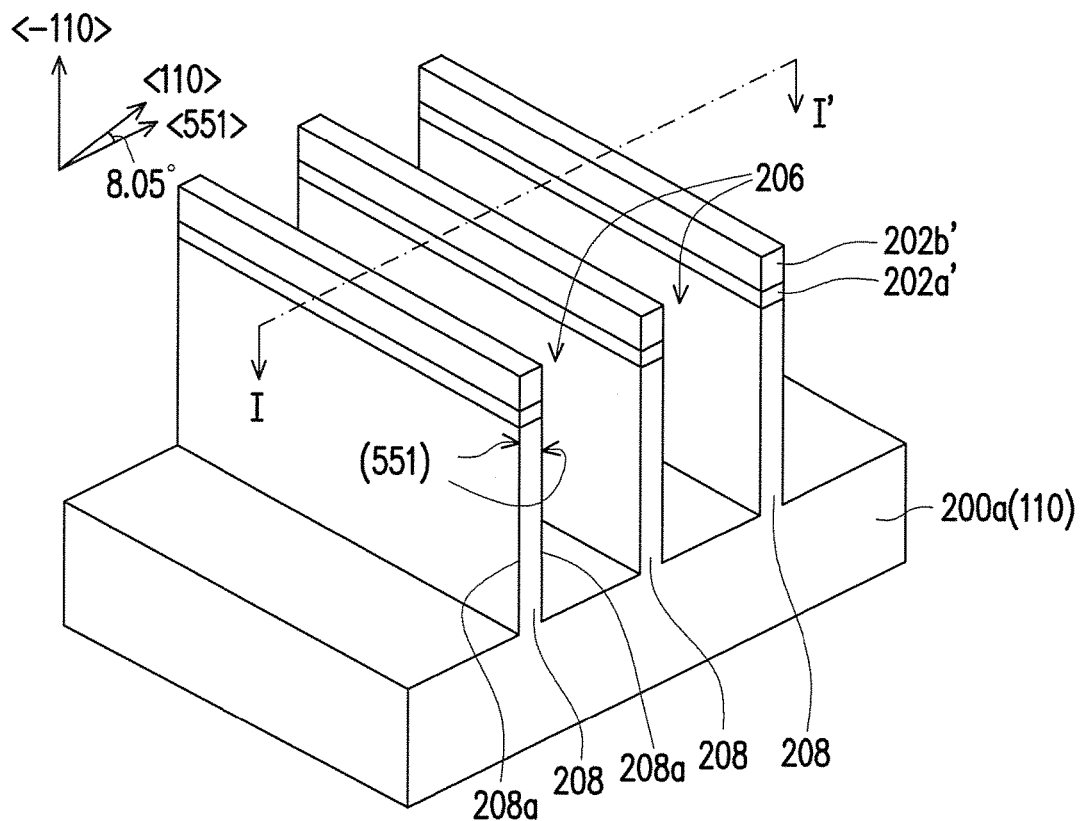
Figure 4B:
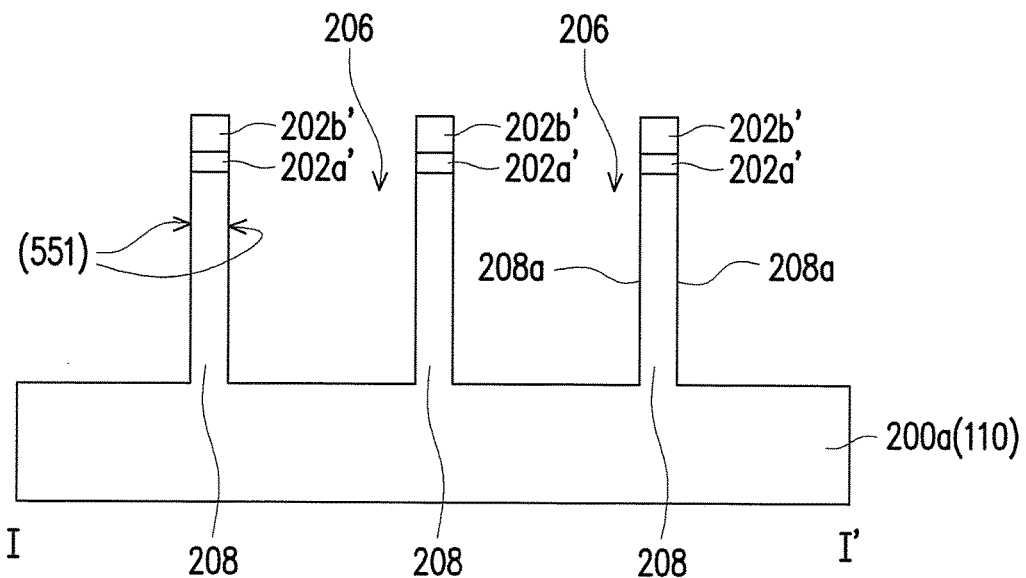

FIG. 3B is a perspective view of the FinFET at one of various stages of the manufacturing method, and FIG. 4B is a cross-sectional view of the FinFET taken along the line I-I' of FIG. 3B. In Step S20 in FIG. 1 and as shown in FIGS. 3A-3B and FIGS. 4A-4B, the mask layer 202b and the pad layer 202a which are not covered by the patterned photoresist layer 204 are sequentially etched to form a patterned mask layer 202b' and a patterned pad layer 202a' so as to expose underlying semiconductor substrate 200. By using the patterned mask layer 202b', the patterned pad layer 202a' and the patterned photoresist layer 204 as a mask, portions of the semiconductor substrate 200 are exposed and etched to form trenches 206 and semiconductor fins 208, and a semiconductor substrate 200a is formed. In one embodiment, a top surface of the semiconductor substrate 200a, which is connected to two adjacent the semiconductor fins, has a (110) lattice plane. The semiconductor fins 208 are covered by the patterned mask layer 202b', the patterned pad layer 202a' and the patterned photoresist layer 204. In one embodiment, the semiconductor fins 208 extend in a direction perpendicular to the <551> direction. Two sidewalls 208a of each of the semiconductor fins 208, which are exposed by the patterned mask layer 202b', the patterned pad layer 202a' and the patterned photoresist layer 204, are disposed on a silicon (551) lattice plane. In addition, the sidewalls of the semiconductor fins 208 have flat surfaces. Two adjacent trenches 206 are spaced apart by a spacing. For example, the spacing between trenches 206 may be smaller than about 30 nm. In other words, two adjacent trenches 206 are spaced apart by a corresponding semiconductor fin 208. Namely, each of the semiconductor fins 208 is located between two adjacent trenches 206.

After the trenches 206 and the semiconductor fins 208 are formed, the patterned photoresist layer 204 is then removed. In at least one embodiment, the patterned photoresist layer 204 may be removed by a plasma ashing process. In one embodiment, a cleaning process may be performed to remove a native oxide of the semiconductor substrate 200a and the semiconductor fins 208. The cleaning process may be performed using diluted hydrofluoric (DHF) acid or other suitable cleaning solutions.

Figure 3C:
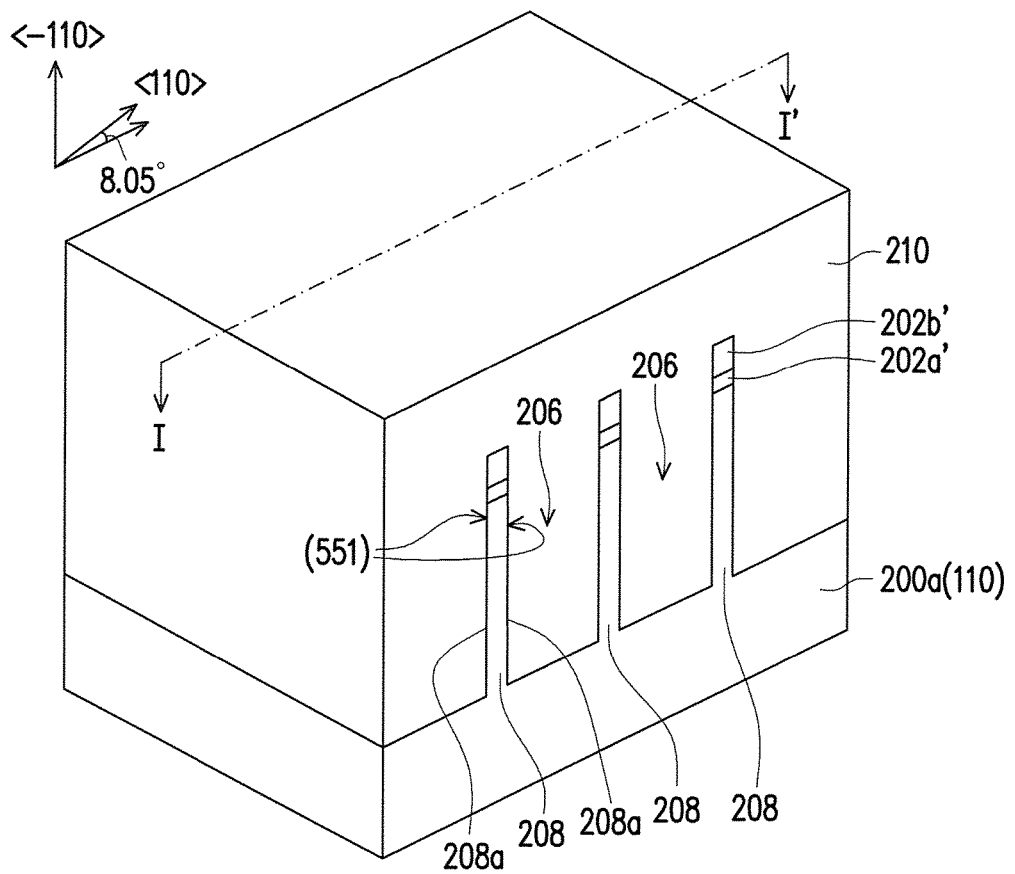
Figure 4C:
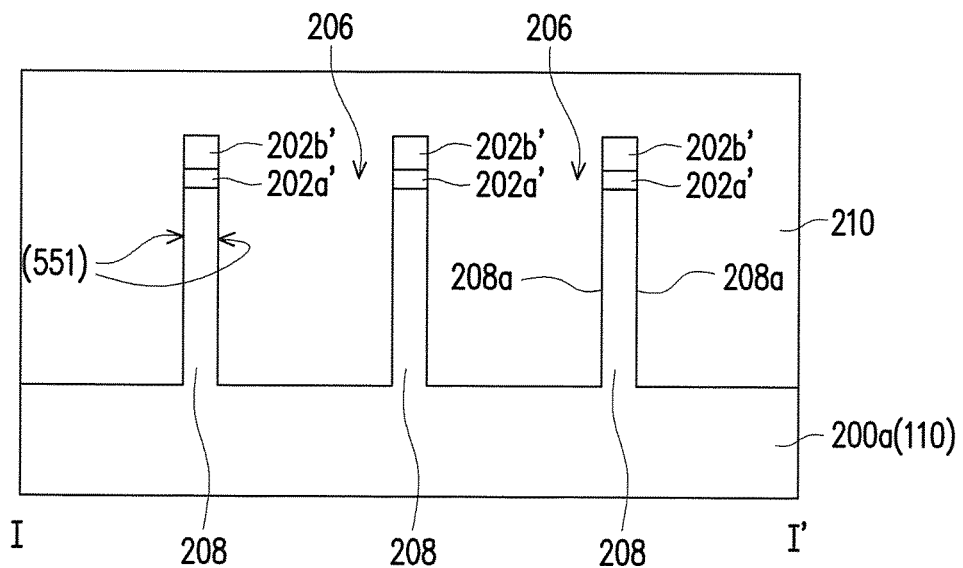

FIG. 3C is a perspective view of the FinFET at one of various stages of the manufacturing method, and FIG. 4C is a cross-sectional view of the FinFET taken along the line I-I' of FIG. 3C. In Step S30 in FIG. 1 and as shown in FIGS. 3B-3C and FIG. 4B-4C, an insulating material 210 is formed over the semiconductor substrate 200a to cover the semiconductor fins 208 and fill up the trenches 206. In addition to the semiconductor fins 208, the insulating material 210 further covers the patterned pad layer 202a' and the patterned mask layer 202b'. The insulating material 210 may include silicon oxide, silicon nitride, silicon oxynitride, a spin-on dielectric material, or a low-K dielectric material. The insulating material 210 may be formed by high-density-plasma chemical vapor deposition (HDP-CVD), sub-atmospheric CVD (SACVD) or by spin-on.

Figure 3D:
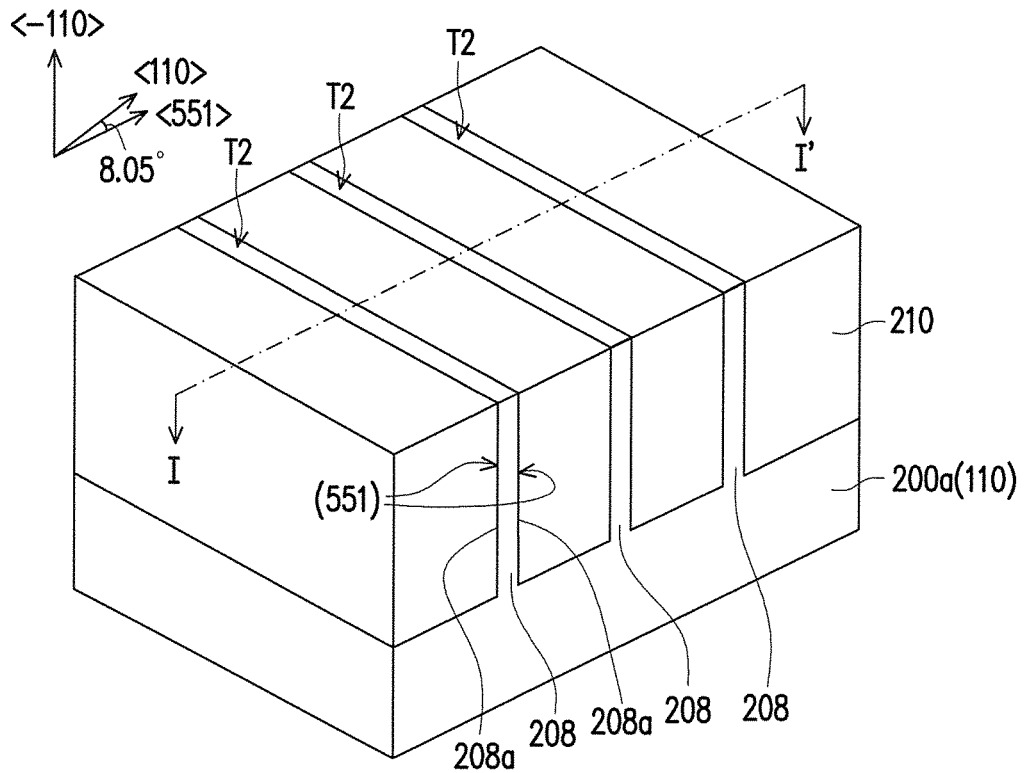
Figure 4D:
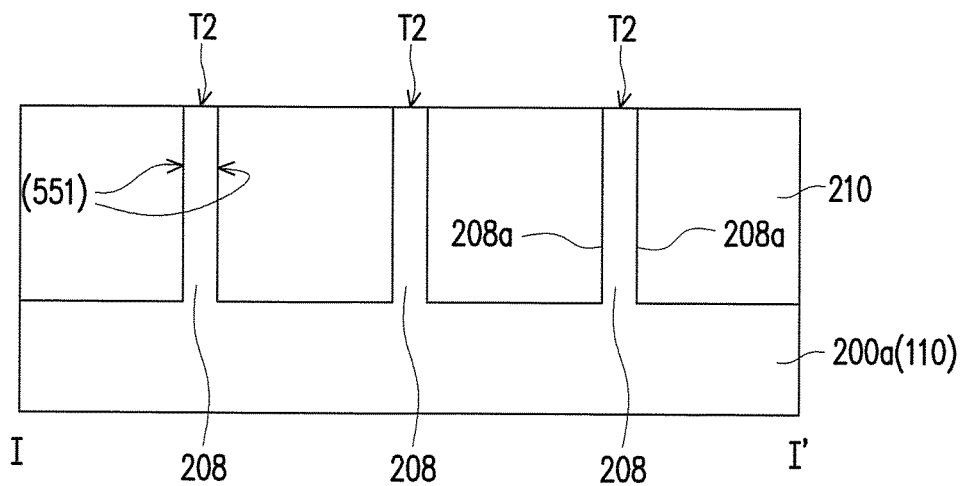

FIG. 3D is a perspective view of the FinFET at one of various stages of the manufacturing method, and FIG. 4D is a cross-sectional view of the FinFET taken along the line I-I' of FIG. 3D. In Step S30 in FIG. 1 and as shown in FIGS. 3C-3D and FIGS. 4C-4D, a chemical mechanical polish process is, for example, performed to remove a portion of the insulating material 210, the patterned mask layer 202b' and the patterned pad layer 202a' until the semiconductor fins 208 are exposed. As shown in FIG. 3D and FIG. 4D, after the insulating material 210 is polished, top surfaces of the polished insulating material 210 is substantially coplanar with top surfaces T2 of the semiconductor fins 208.

Figure 3E:
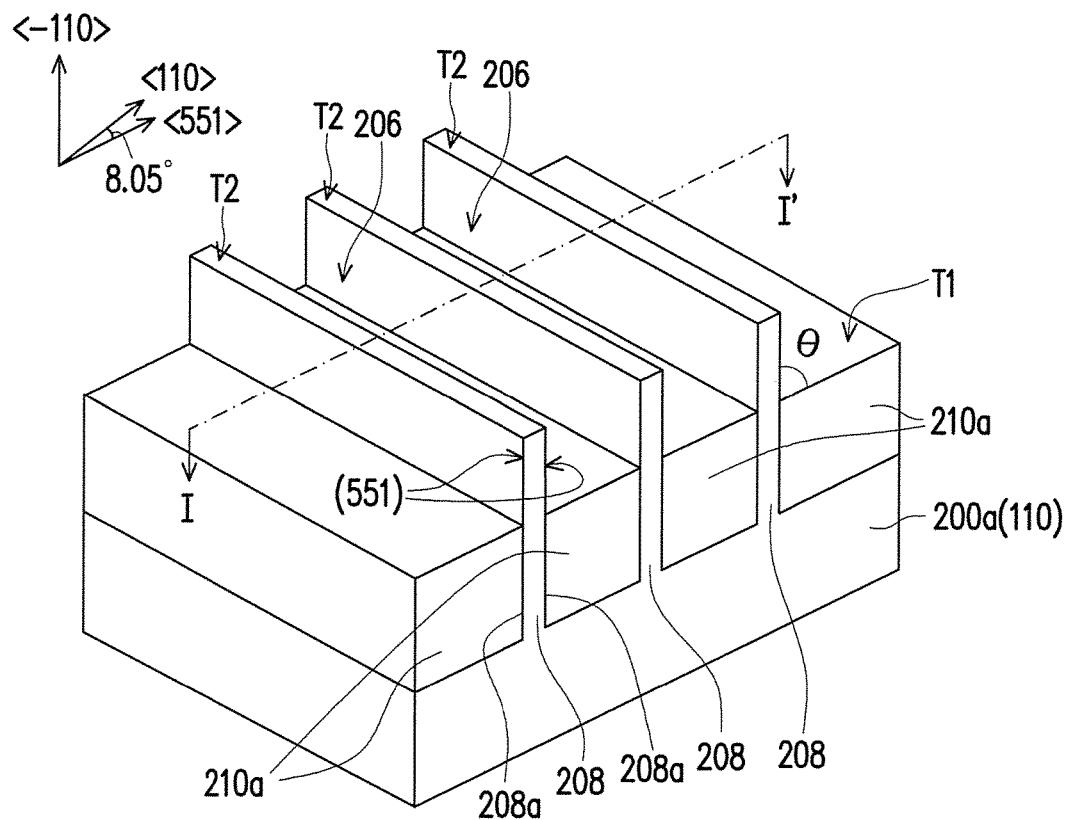
Figure 4E:
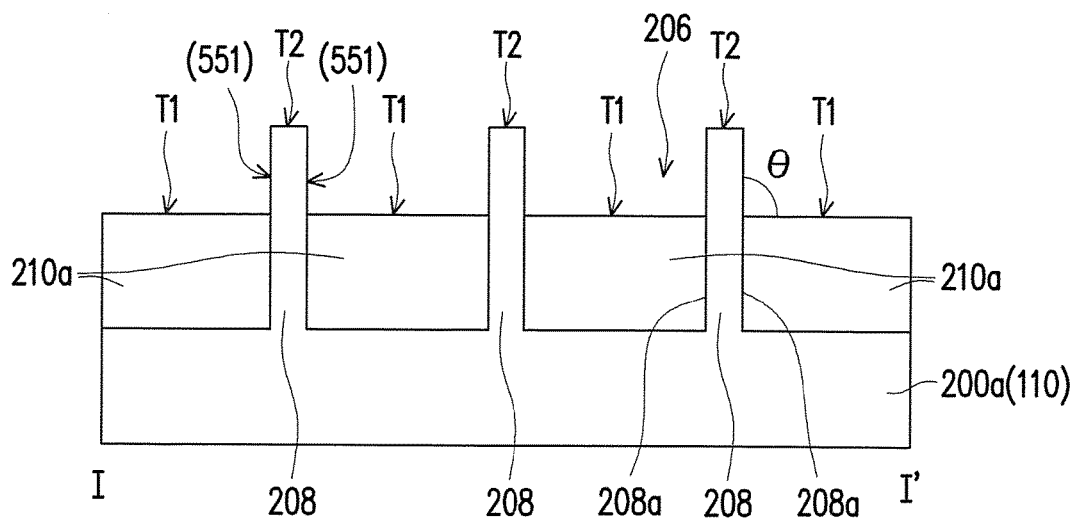

FIG. 3E is a perspective view of the FinFET at one of various stages of the manufacturing method, and FIG. 4E is a cross-sectional view of the FinFET taken along the line I-I' of FIG. 3E. In Step S30 in FIG. 1 and as shown in FIGS. 3D-3E and FIGS. 4D-4E, the polished insulating material 210 filled in the trenches 206 is partially removed by an etching process such that insulators 210a are formed on the semiconductor substrate 200a and each insulator 210a is located between two adjacent semiconductor fins 208. In at least one embodiment, an included angle θ between a top surface T1 of one of the insulators 210a and one of the sidewalls of the semiconductor fins 208 may be 90°. In one embodiment, the etching process may be a wet etching process with hydrofluoric acid (HF) or a dry etching process. The top surfaces T1 of the insulators 210a are lower than the top surfaces T2 of the semiconductor fins 208. That is, the semiconductor fins 208 protrude from the top surfaces T1 of the insulators 210a. The height difference between the top surfaces T2 of the semiconductor fins 208 and the top surfaces T1 of the insulators 210a ranges from about 15 nm to about 50 nm.

Figure 3F:
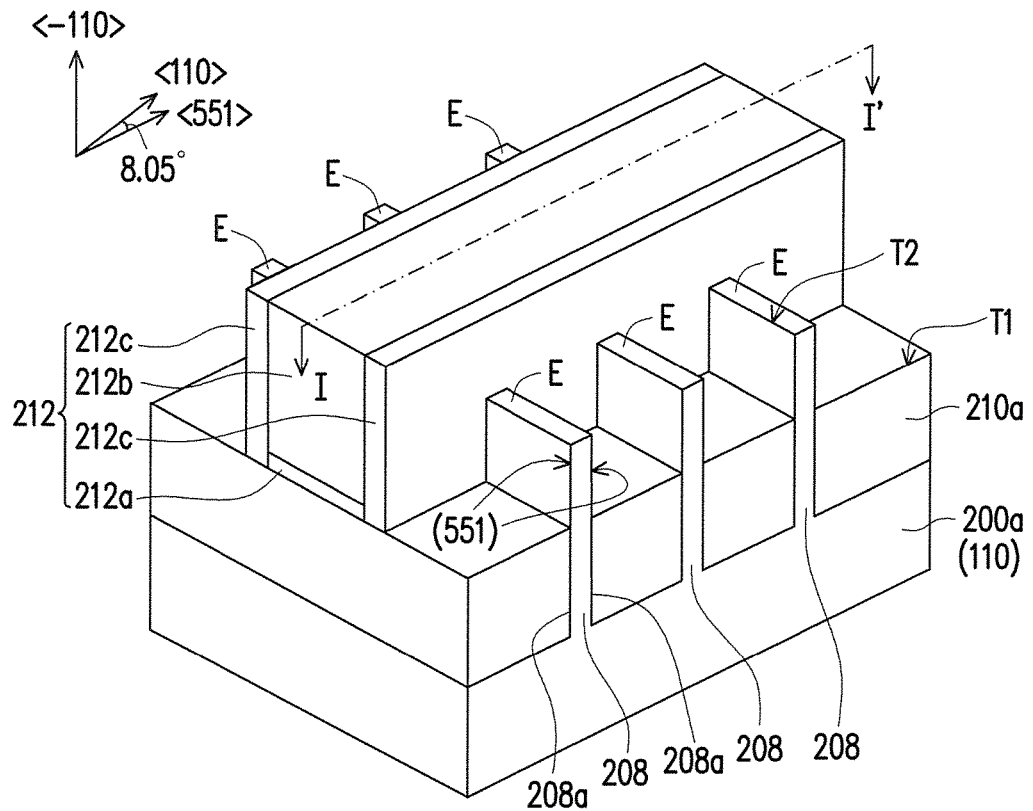
Figure 4F:
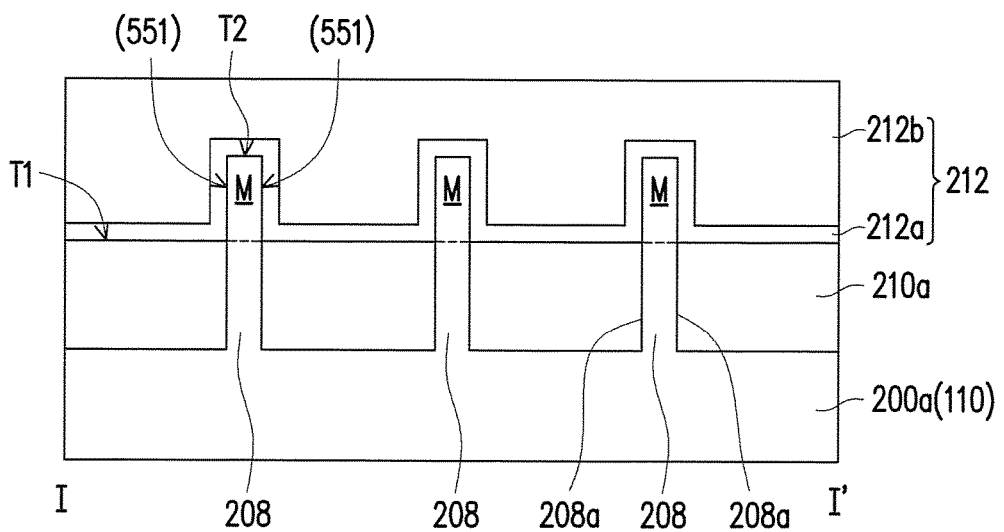

FIG. 3F is a perspective view of the FinFET at one of various stages of the manufacturing method, and FIG. 4F is a cross-sectional view of the FinFET taken along the line I-I' of FIG. 3F. In Step S40 in FIG. 1 and as shown in FIGS. 3E-3F and FIGS. 4E-4F, a gate stack 212 is formed over portions of the semiconductor fins 208 and portion of the insulators 210a, along the <551> direction. In other words, the gate stack 212 extends in the <551> direction. In one embodiment, the extending direction (e.g., the <551> direction) of the gate stack 212 is, for example, perpendicular to the extending direction of the semiconductor fins 208 so as to cover a middle portions M (shown in FIG. 4F) of the semiconductor fins 208. A contact region between the gate stack 212 and one of the semiconductor fins 208 is located on the middle portions M, in which the contact region is disposed on the silicon (551) plane. The aforesaid middle portions M may act as channels of the tri-gate FinFET. In this configuration, the sidewalls of the semiconductor fins 208 (e.g., the middle portions M or the channel) are particularly smooth at the atomic level (for silicon atoms), thereby forming the flatten sidewalls of the semiconductor fins 208 as mentioned in FIG. 3B and FIG. 4B, which tend to promote higher carrier mobility and higher device performance. The gate stack 212 comprises a gate dielectric layer 212a and a gate electrode layer 212b disposed over the gate dielectric layer 212a. The gate dielectric layer 212b is disposed over portions of the semiconductor fins 208 and over portions of the insulators 210a.

The gate dielectric 212a is formed to cover the middle portions M of the semiconductor fins 208. In some embodiments, the gate dielectric layer 212a may include silicon oxide, silicon nitride, silicon oxy-nitride, or high-k dielectrics. High-k dielectrics comprise metal oxides. Examples of metal oxides used for high-k dielectrics include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu, and/or mixtures thereof. In one embodiment, the gate dielectric layer 212a is a high-k dielectric layer with a thickness in the range of about 10 to 30 angstroms. The gate dielectric layer 212a may be formed using a suitable process such as atomic layer deposition (ALD), chemical vapor deposition (CVD), physical vapor deposition (PVD), thermal oxidation, UV-ozone oxidation, or combinations thereof. The gate dielectric layer 212a may further comprise an interfacial layer (not shown) to reduce damage between the gate dielectric layer 212a and semiconductor fins 208. The interfacial layer may comprise silicon oxide.

The gate electrode layer 212b is then formed on the gate dielectric layer 212a. In some embodiments, the gate electrode layer 212b may comprise a single layer or multi-layered structure. In some embodiments, the gate electrode layer 212b may comprise poly-silicon or metal, such as Al, Cu, W, Ti, Ta, TiN, TiAl, TiAlN, TaN, NiSi, CoSi, other conductive materials with a work function compatible with the semiconductor substrate material, or combinations thereof. In some embodiments, the gate electrode layer 212b includes a silicon-containing material, such as poly-silicon, amorphous silicon or a combination thereof, and is formed prior to the formation of the strained material 214. In some embodiments, the gate electrode layer 212b comprises a thickness in the range of about 30 nm to about 60 mm. The gate electrode layer 212b may be formed using a suitable process such as ALD, CVD, PVD, plating, or combinations thereof.

In addition, the gate stack 212 may further comprise spacers 212c disposed on sidewalls of the gate dielectric layer 212a and the gate electrode layer 212b. In one embodiment, a pair of spacer 212c may be formed to further cover portions of the semiconductor fins 208. The spacers 212c are formed of dielectric materials, such as silicon nitride or SiCON. The spacers 212c may include a single layer or multilayer structure. Portions of the semiconductor fins 208 that are not covered by the gate stack 212 are referred to as exposed portions E hereinafter.

Figure 3G:
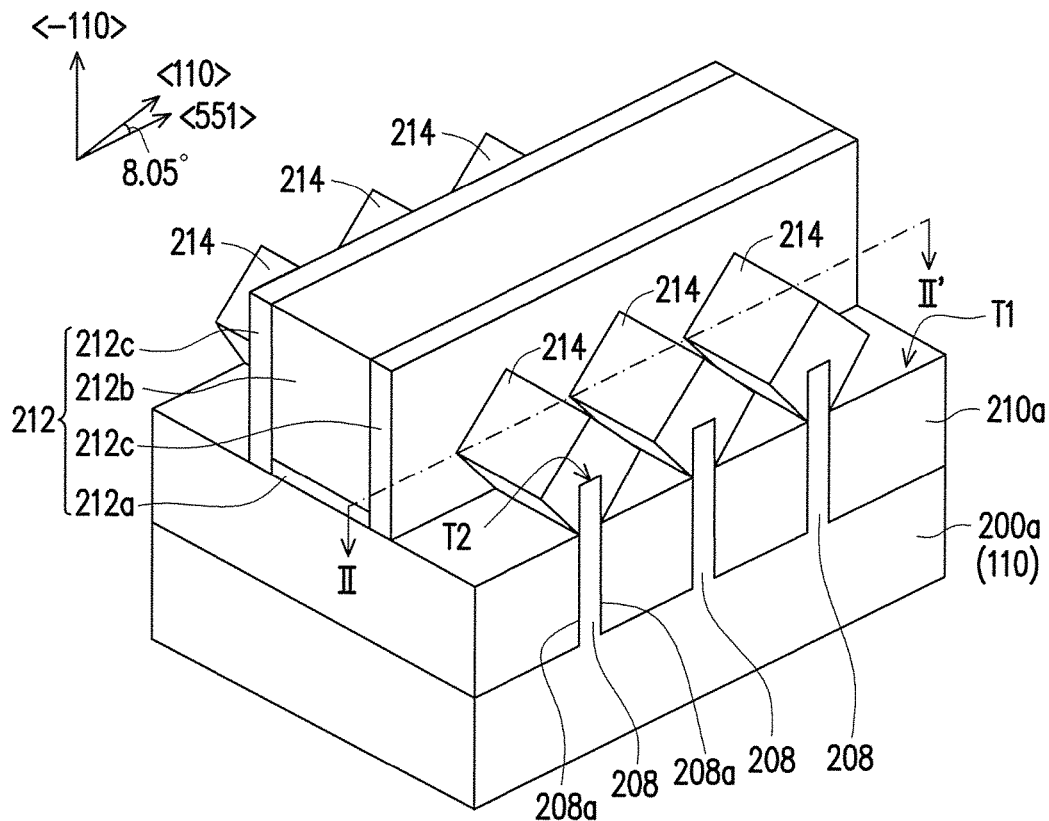
Figure 4G:
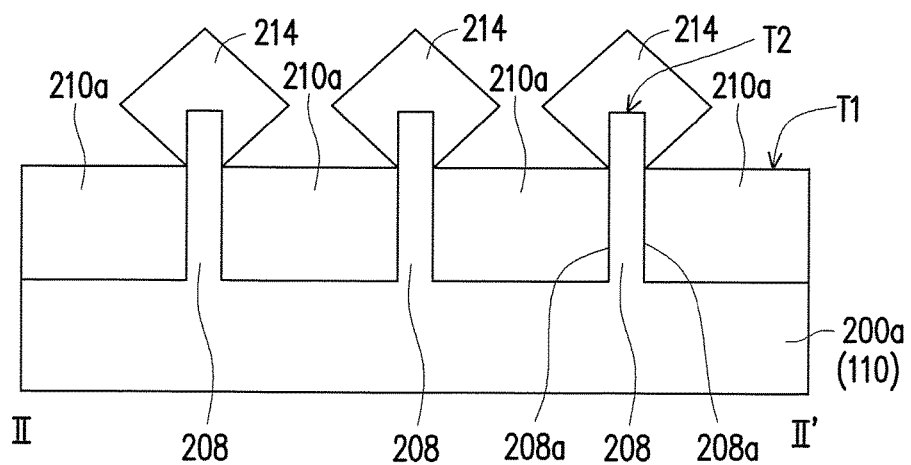

FIG. 3G is a perspective view of the FinFET at one of various stages of the manufacturing method, and FIG. 4G is a cross-sectional view of the FinFET taken along the line II-II' of FIG. 3G, where the line II-II' extends in the <551> direction. In Step S50 in FIG. 1 and as shown in FIGS. 3F-3G and FIGS. 4F-4G, strained material portions 214 are formed over the semiconductor fins 208 revealed by the gate stack 212 and extend beyond the top surfaces T1 of the insulators 210a, as shown in FIG. 3G and FIG. 4G. The strained material portions 214 comprise a source disposed at a side of the stack gate 212 and a drain disposed at the other side of the gate stack 212. The source covers an end of the semiconductor fins 208 and the drain covers the other end of the semiconductor fins 208. In one embodiment, the strained material portions 214, such as silicon carbon (SiC), are epitaxial-grown by a LPCVD process to form the sources and drains of the n-type FinFET. In another embodiment, the strained material portions 214, such as silicon germanium (SiGe), are epitaxial-grown by a LPCVD process to form the sources and drains of the p-type FinFET.

Figure 5A:
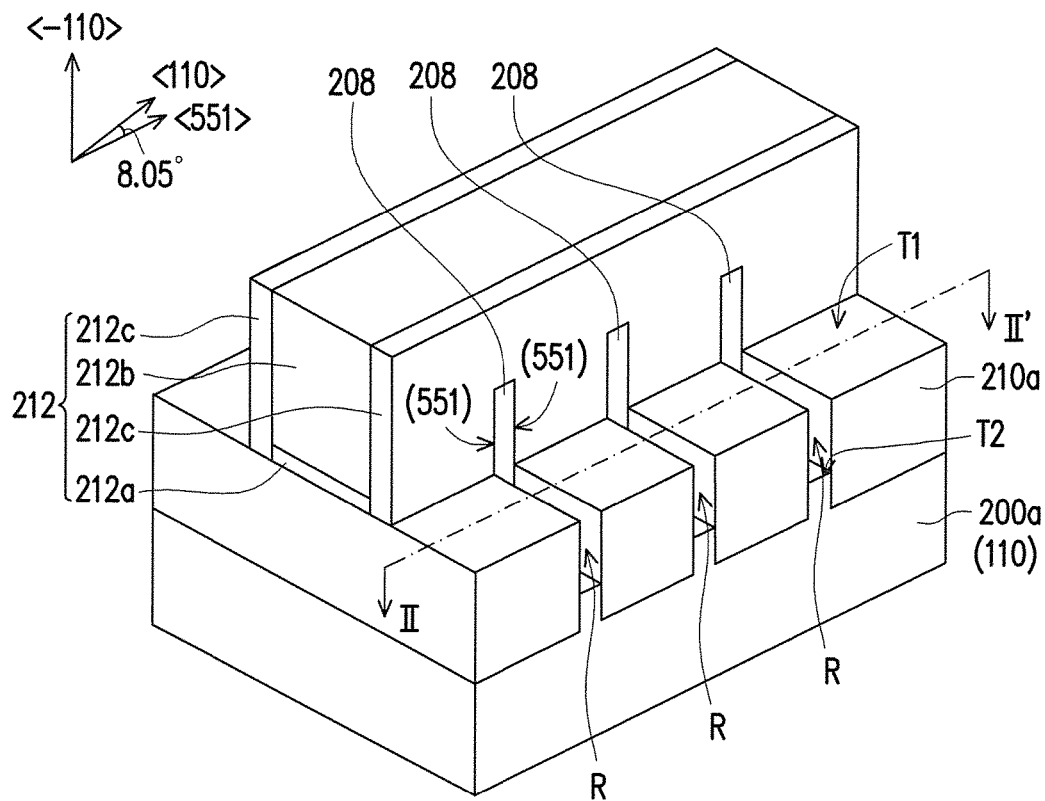
FIGS. 5A-5B are perspective views of another method for fabricating a FinFET in accordance with some embodiments.
Figure 6A:
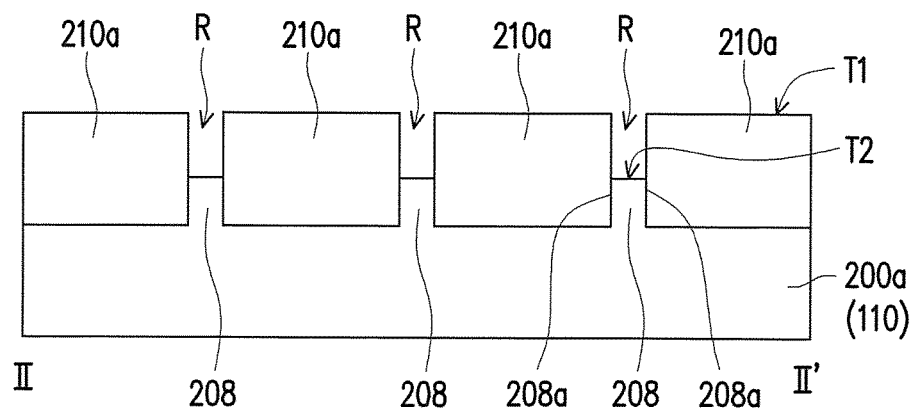
FIGS. 6A-6B are cross-sectional views of another method for fabricating a FinFET in accordance with some embodiments.

FIG. 5A is a perspective view of the FinFET at one of various stages of another manufacturing method, and FIG. 6A is a cross-sectional view of the FinFET taken along the line II-II' of FIG. 5A, where the line II-II' extends in the <551> direction and parallel to the line I-I' and the line II-II' depicted in FIGS. 3A-3G and FIGS. 4A-4G. In the embodiment, the fabricating steps for the FinFET include performing the process steps the same with or similar to the steps showing in FIGS. 3A-3F and FIGS. 4A-4F. After forming the gate stack 212, the exposed portions E of the semiconductor fins 208 (as shown in FIG. 3F) are removed and recessed to formed recessed portions R (as shown in FIG. 5A and FIG. 6A). For example, the exposed portions E are removed by anisotropic etching, isotropic etching or the combination thereof. In some embodiments, the exposed portions E of the semiconductor fins 208 are recessed below the top surfaces T1 of the insulators 210a. The depth of the recessed portions R is less than the thickness of the insulators 210a. In other words, the exposed portions E of the semiconductor fins 208 are not entirely removed. In this case, the top of each semiconductor fin 208 is lower than the top surface T1 of the insulator 210a. Namely, the top surfaces T1 of the insulators 210 and the top surfaces T2' of the semiconductor fins 208 are in different elevations. In addition, as show in FIG. 5A and FIG. 6A, portions of the semiconductor fins 208 covered by the gate stack 212 is not removed when the exposed portions E of the semiconductor fins 208 are recessed. The portions of the semiconductor fins 208 covered by the gate stack 212 are exposed at sidewalls of the gate stack 212.

Figure 5B:
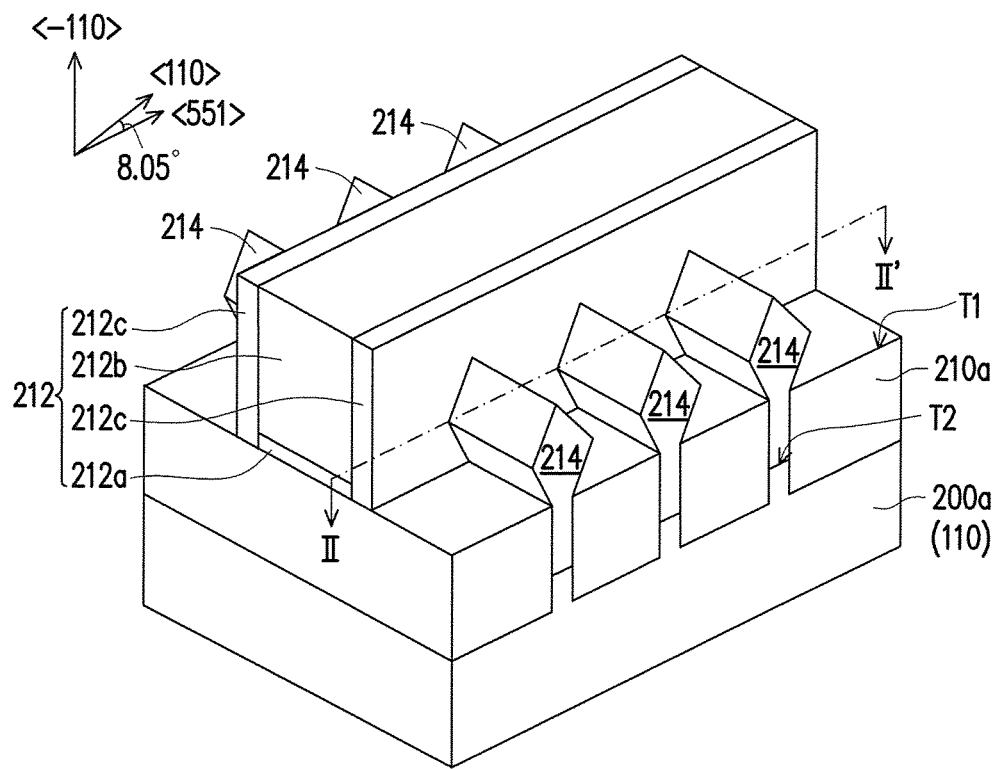
Figure 6B:
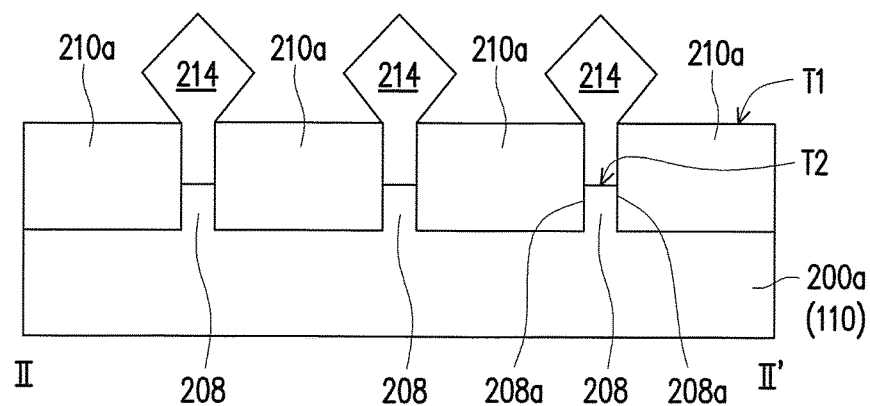

FIG. 5B is a perspective view of the FinFET at one of various stages of the manufacturing method, and FIG. 6B is a cross-sectional view of the FinFET taken along the line II-II' of FIG. 5B. In Step S50 in FIG. 1 and as shown in FIGS. 5A-5B and FIGS. 6A-6B, the strained material portions 214 are formed over the recessed portions R of the semiconductor fins 208 and extend beyond the top surfaces T1 of the insulators 210a to strain or stress the semiconductor fins 208. The strained material portions 214 comprise a source disposed at a side of the stack gate 212 and a drain disposed at the other side of the gate stack 212. The source covers an end of the semiconductor fins 208 and the drain covers the other end of the semiconductor fins 208. In one embodiment, the strained material portions 214, such as silicon carbon (SiC), are epitaxial-grown by a LPCVD process to form the sources and drains of the n-type FinFET. In another embodiment, the strained material portions 214, such as silicon germanium (SiGe), are epitaxial-grown by a LPCVD process to form the sources and drains of the p-type FinFET.

In accordance with some embodiments of the present disclosure, a method of fabricating a FinFET includes at last the following steps. A <551> direction is determined by tilting 8.05±2 degrees from a normal vector of a (110) lattice plane of a semiconductor substrate. The semiconductor substrate is patterned along a lattice plane perpendicular to the <551> direction, so as to form a plurality of trenches in the semiconductor substrate and at least one semiconductor fin having sidewalls disposed on a (551) lattice plane. Insulators are in the trenches. A gate stack is formed over portions of the semiconductor fin and over portions of the insulators. Strained material portions are formed over the semiconductor fins revealed by the gate stack.

In accordance with some embodiments of the present disclosure, a method of fabricating a FinFET includes at last the following steps. A semiconductor substrate having a (110) lattice plane is provided. A normal vector of the (110) lattice plane is determined. A <551> direction is determined by tilting 8.05±2 degrees from the normal vector of the (110) lattice plane. A patterned photoresist layer corresponding to a lattice plane perpendicular to the <551> direction is formed over the semiconductor substrate. The semiconductor substrate is patterned by using the patterned photoresist layer as mask to form a plurality of trenches in the semiconductor substrate and at least one semiconductor fin between the trenches, wherein sidewalls of the semiconductor fin are formed to dispose on a (551) lattice plane. The patterned photoresist layer is removed. Insulators in the trenches are formed. A gate stack is formed over portions of the semiconductor fin and over portions of the insulators. Strained material portions are formed over the semiconductor fin revealed by the gate stack.

In accordance with some embodiments of the present disclosure, a FinFET includes a semiconductor substrate, a plurality of insulators, a gate stack, and strained material portions. The semiconductor substrate includes at least two semiconductor fins thereon, wherein sidewalls of each semiconductor fin are disposed on a (551) lattice plane, and a top surface of the semiconductor substrate connected two adjacent the semiconductor fins is disposed on a (110) lattice plane. The insulators are disposed on the semiconductor substrate, and the semiconductor fins are sandwiched by the insulators. A gate stack is located over portions of the semiconductor fins and over portions of the insulators. The strained material portions cover portions of the semiconductor fins revealed by the gate stack.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating a fin field effect transistor (FinFET), comprising:
    determining a <551> direction by tilting 8.05±2 degrees from a normal vector of a (110) lattice plane of a semiconductor substrate;
    patterning the semiconductor substrate along a lattice plane perpendicular to the <551> direction to form a plurality of trenches in the semiconductor substrate and at least one semiconductor fin having sidewalls disposed on a (551) lattice plane;
    forming a plurality of insulators in the plurality of trenches, respectively;
    forming a gate stack over portions of the at least one semiconductor fin and over portions of the plurality of insulators; and
    forming strained material portions over the at least one semiconductor fin revealed by the gate stack.

2. The method of claim 1, wherein the gate stack is formed along the <551> direction.

3. The method of claim 1, wherein an extending direction of the gate stack is perpendicular to an extending direction of the at least one semiconductor fin.

4. The method of claim 1, wherein the at least one semiconductor fin is formed between two adjacent trenches of the plurality of trenches.

5. The method of claim 4, wherein an included angle between one of the plurality of insulators and one of the sidewalls of the at least one semiconductor fin is 90°.

6. The method of claim 1, further comprising:
    removing the at least one semiconductor fin revealed by the gate stack to form recessed portions of the at least one semiconductor fin after forming the gate stack, and the strained material portions filling into the recessed portions of the at least one semiconductor fin.

7. A method of fabricating a fin field effect transistor (FinFET), comprising:
    providing a semiconductor substrate having a (110) lattice plane;
    determining a normal vector of the (110) lattice plane;
    determining a <551> direction by tilting 8.05±2 degrees from the normal vector of the (110) lattice plane;
    forming a patterned photoresist layer corresponding to a lattice plane perpendicular to the <551> direction over the semiconductor substrate;
    patterning the semiconductor substrate by using the patterned photoresist layer as a mask to form a plurality of trenches in the semiconductor substrate and at least one semiconductor fin between adjacent trenches of the plurality of trenches, wherein sidewalls of the at least one semiconductor fin are formed to dispose on a (551) lattice plane;
    removing the patterned photoresist layer;
    forming a plurality of insulators in the plurality of trenches, respectively;
    forming a gate stack over portions of the at least one semiconductor fin and over portions of the plurality of insulators; and
    forming strained material portions over the at least one semiconductor fin revealed by the gate stack.

8. The method of claim 7, wherein the gate stack is formed along the <551> direction.

9. The method of claim 7, wherein an extending direction of the gate stack is perpendicular to an extending direction of the at least one semiconductor fin.

10. The method of claim 7, wherein an included angle between one of the plurality of insulators and one of the sidewalls of the at least one semiconductor fin is 90°.

11. The method of claim 7, further comprising:
removing the at least one semiconductor fin revealed by the gate stack to form recessed portions of the at least one semiconductor fin after forming the gate stack, and the strained material portions filling into the recessed portions of the at least one semiconductor fin.

12. The method of claim 7, wherein the strained material portions comprise SiGe doped with a p-type dopant, or the strained material portions comprise SiC doped with an n-type dopant.

13. A fin field effect transistor (FinFET), comprising:
a semiconductor substrate comprising at least two semiconductor fins thereon, wherein sidewalls of each semiconductor fin of the at least two semiconductor fins are disposed on a (551) lattice plane, and a top surface of the semiconductor substrate connected to two adjacent semiconductor fins of the at least two semiconductor fins has a (110) lattice plane;
a plurality of insulators disposed on the semiconductor substrate, each semiconductor fin of the at least two semiconductor fins being sandwiched by adjacent insulators of the plurality of insulators;
a gate stack over portions of the at least two semiconductor fins and over portions of the plurality of insulators; and
strained material portions covering the portions of the at least two semiconductor fins revealed by the gate stack.

14. The FinFET of claim 13, wherein the gate stack comprises:
a gate dielectric layer disposed over the at least two semiconductor fins;
a gate disposed over the gate dielectric layer; and
a plurality of spacers disposed on sidewalls of the gate dielectric layer and the gate.

15. The FinFET of claim 13, wherein each sidewall of the at least two semiconductor fins is flat.

16. The FinFET of claim 13, wherein the gate stack extends in a <551> direction.

17. The FinFET of claim 13, wherein an extending direction of the gate stack is perpendicular to an extending direction of the at least two semiconductor fins.

18. The FinFET of claim 13, wherein an included angle between one of the plurality of insulators and one of the sidewalls of the at least two semiconductor fins is 90°.

19. The FinFET of claim 13, wherein each semiconductor fin of the at least two semiconductor fins further comprises recessed portions, and the strained material portions fill into the recessed portions of each semiconductor fin of the at least two semiconductor fins.

20. The FinFET of claim 13, wherein the strained material portions comprise SiGe doped with a p-type dopant, or the strained material portions comprise SiC doped with an n-type dopant.

* * * * *